United States Patent [19]

Zinky et al.

[11] 4,408,874
[45] Oct. 11, 1983

[54] PROJECTION ALIGNER WITH SPECIFIC MEANS FOR BENDING MIRROR

[75] Inventors: William Zinky, Los Altos; Larry Rosenberg, San Jose, both of Calif.

[73] Assignee: Computervision Corporation, Santa Clara, Calif.

[21] Appl. No.: 261,674

[22] Filed: May 7, 1981

[51] Int. Cl.³ .............................................. G03B 27/68
[52] U.S. Cl. ...................................................... 355/52
[58] Field of Search ............................... 355/52, 50, 51

[56] References Cited

U.S. PATENT DOCUMENTS

| | | | |
|---|---|---|---|
| 1,457,209 | 5/1923 | Chanier | 355/52 |
| 1,853,072 | 4/1932 | Morioka | 355/50 |
| 2,207,236 | 7/1940 | Uden | 355/52 |
| 2,314,272 | 3/1943 | Grudin . | |
| 2,565,446 | 8/1951 | Abbott | 355/52 |
| 3,582,331 | 6/1971 | Howe | 355/52 |
| 3,692,407 | 9/1972 | Ramsay | 355/52 |
| 3,790,272 | 2/1974 | Knechtel et al. | 355/51 |
| 3,813,160 | 5/1974 | Nowak | 355/52 |
| 3,900,258 | 8/1975 | Hoppner et al. | 355/51 |
| 3,972,600 | 8/1976 | Cobarg . | |
| 4,059,346 | 11/1977 | Levine et al. . | |

*Primary Examiner*—Monroe H. Hayes
*Attorney, Agent, or Firm*—Robert G. Slick

[57] ABSTRACT

A projection aligner is provided wherein anamorphic metric distortion can be introduced in the projection image by employing a bending mirror that makes a slight change in magnification along one axis of the image. In one embodiment of the invention a pneumatic bending mechanism is employed and in another embodiment, a mechanical system is employed.

3 Claims, 15 Drawing Figures

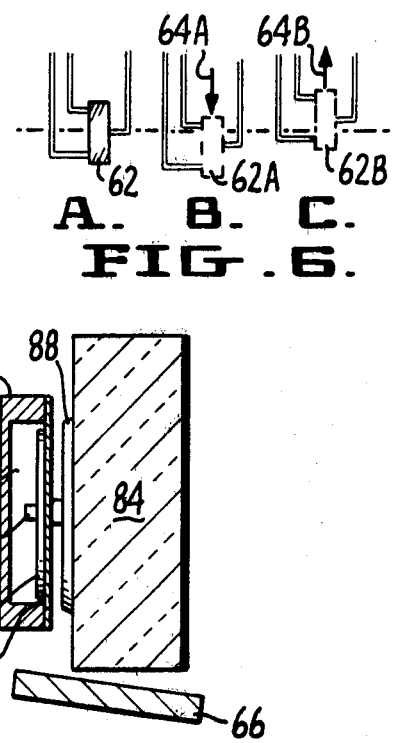
FIG. 6.
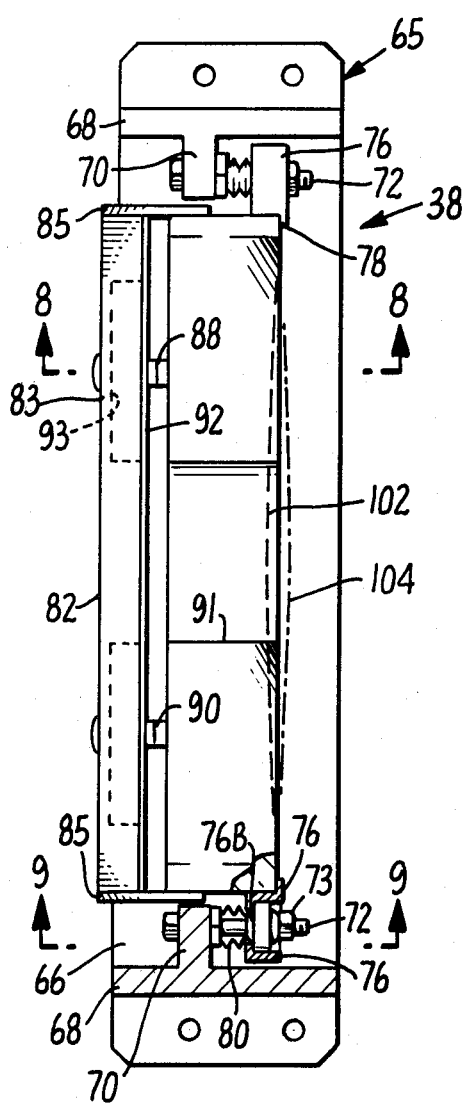
FIG. 7.
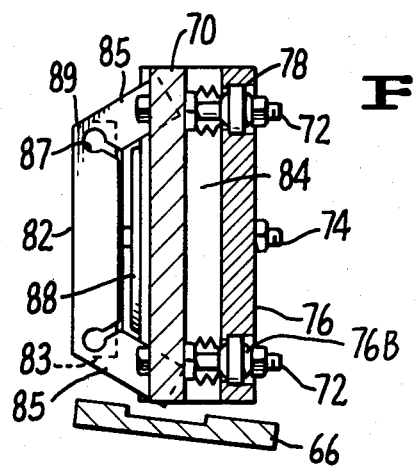
FIG. 8.
FIG. 9.
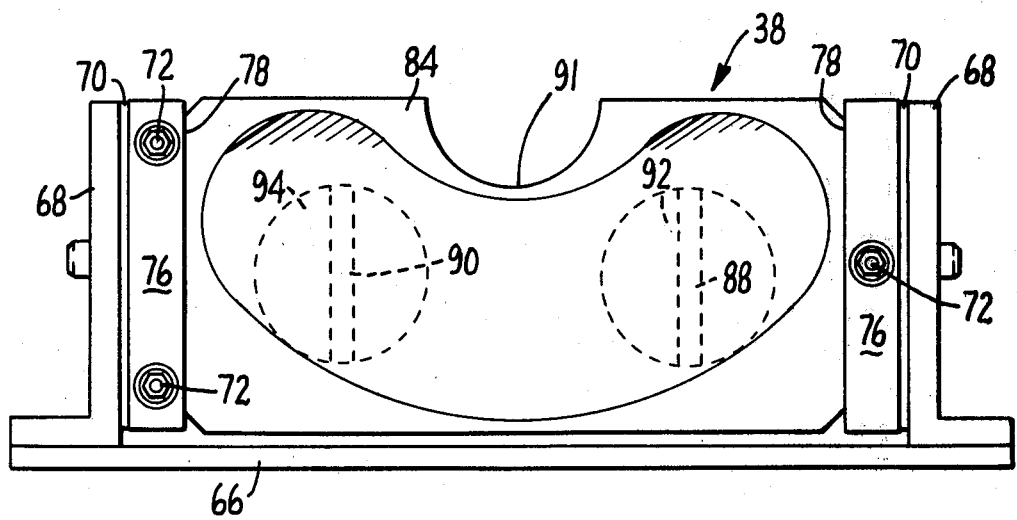
FIG. 10.

PROJECTION ALIGNER WITH SPECIFIC MEANS FOR BENDING MIRROR

SUMMARY OF THE INVENTION

In making integrated circuits and similar electronic devices a very precise projection system must be employed to project the image of a mask onto a sensitized wafer. Ordinarily such wafers must be exposed a number of times to form the different layers which constitute the ultimate circuit. In other words, a coated wafer would be exposed, developed and one or more diffusion and/or deposition operations conducted on the wafer and the wafer would then again be coated with a second layer of resist, exposed to another mask and so on. Thus, since the wafer must be exposed a number of times and frequently will be moved from one machine to another for various exposures, it is necessary to provide precise masks and projection optics so that the repeated exposures will be in registration. If masks were precisely the same size and projection optics magnification precisely the same, this would not present a problem, providing that all of the residual errors in the projection optics did not add up to produce objectionable metric distortion. Metric distortion is defined as a measure of the variance in spacing between well-resolved points in the aerial image of the mask object.

Even though all points in the aerial image are well-resolved and diffraction limited, residual metric distortion errors may contribute as much as 1, 2 or 3 microns of misregistration between pairs of image points that are separated by 100 millimeters or more on wafer and projected mask image.

In accordance with the broad aspect of the present invention it has been found that the image size and placement can be slightly altered by bending one of the mirrors in the optical chain along one axis. Although the change is anamorphic caused by introduction of a cylindrical folding mirror which produces variable metric distortion to register the image to wafer along the length of the scanning slit only, this is of no consequence because metric distortion along the narrow axis of the slit is negligible. For example: With a slit that is 100 millimeters long and 1 millimeter wide, an error in projection magnification of 20 parts per million results in a misregistration of ±0.00002 mm for points separated by 1 mm, and 0.002 mm for points separated by 100 mm. Therefore, misregistration along the narrow axis of the slit is negligible; points at the ends of the long axis of the slit are misregistered by 100 times as much or ±2 microns.

Therefore, misregistration in the narrow slit axis may be ignored and a weak cylindrical mirror caused by bending a flat mirror can be used to eliminate misregistration in the image along the long axis of the slit.

In the past, bending mirrors have been employed to enhance image quality; in the present invention the quality of the image is not improved but rather the size, and thus the placement, are changed.

Accordingly, the present invention provides anamorphic magnification or reduction but nevertheless is adequate for the purpose since, as is pointed out above, exposure takes place through such a small slit that the employment of a cylindrical element imposes no handicap.

It will be understood that the amount of curvature provided by the present invention is very small so that the deformation over the active unit area of the mirror is actually less than the diffraction limit for any image point.

The amount of correction required for perfect registration is accordingly very slight and is on the order of ±20 parts per million, i.e. ±80μ inches over 4 inches.

As is brought out later in the specification, the mounting of the mirror is extremely important. Alignment of the mirror and bending of the mirror have separate and independent adjustments. Therefore, bending the mirror to correct metric distortion does not misalign the mirror.

The reflective surface of the mirror is bent to a concave or convex front surface by forces applied in tension or compression attached to the edges of the mirror and the center portion of the back mirror surface.

The invention is not limited to any one of the various mechanical means which can be employed to distort the mirror. One preferred system is to use pneumatic means since it is easy to achieve precise control and to measure the force employed by the use of a simple manometer. Another effective means is a spring mounted screw(s) which presses against the mirror.

Various additional features and advantages of the invention are brought out in the balance of the specification.

BRIEF DESCRIPTION OF THE DRAWINGS

FIG. 6A shows the image produced from a mask from a plane mirror.

FIG. 6B shows the image produced from a similar mask wherein the image has been displaced slightly to one side.

FIG. 6C shows a similar view showing the image displaced to the opposite side.

FIG. 7 is a side view, partly in section, of the mirror support of a bendable mirror.

FIG. 8 is a simplified top sectional view of the mirror bending system on the line 8—8 of FIG. 7 and also showing the use of a manometer to determine the amount of vacuum or pressure produced on the piston driving the mirror.

FIG. 9 is a section on the line 9—9 of FIG. 7.

FIG. 10 is a plan view of the bending or relay mirror.

DESCRIPTION OF THE PREFERRED EMBODIMENTS

Figure 1:
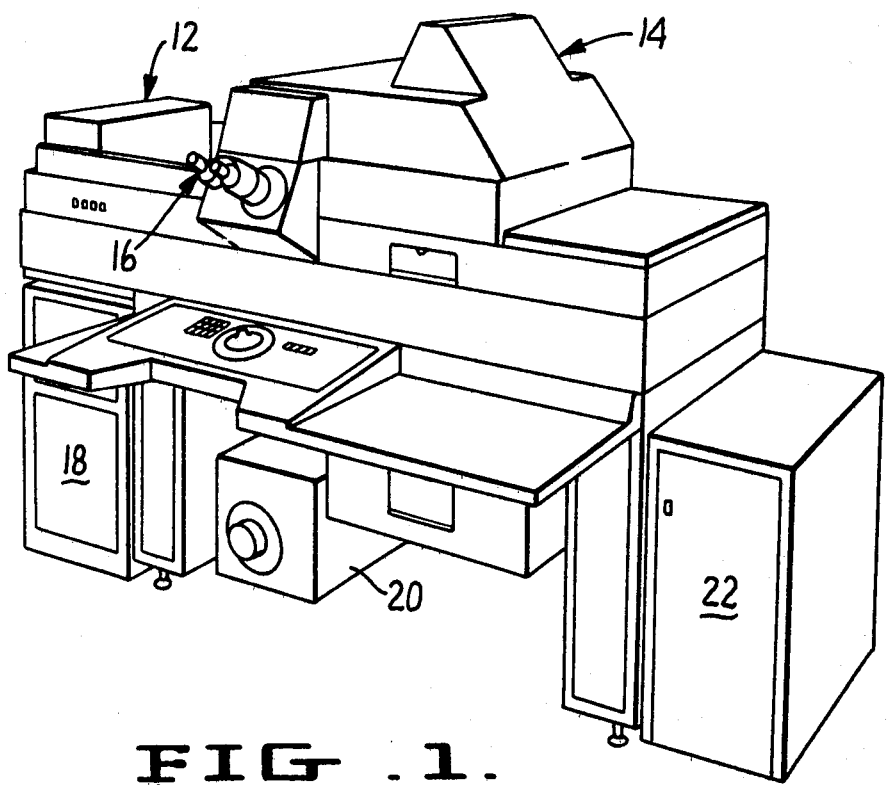
FIG. 1 is a perspective view of a projection printer suitable for use in the manufacture of integrated circuits by a photo masking process.
Figure 2:
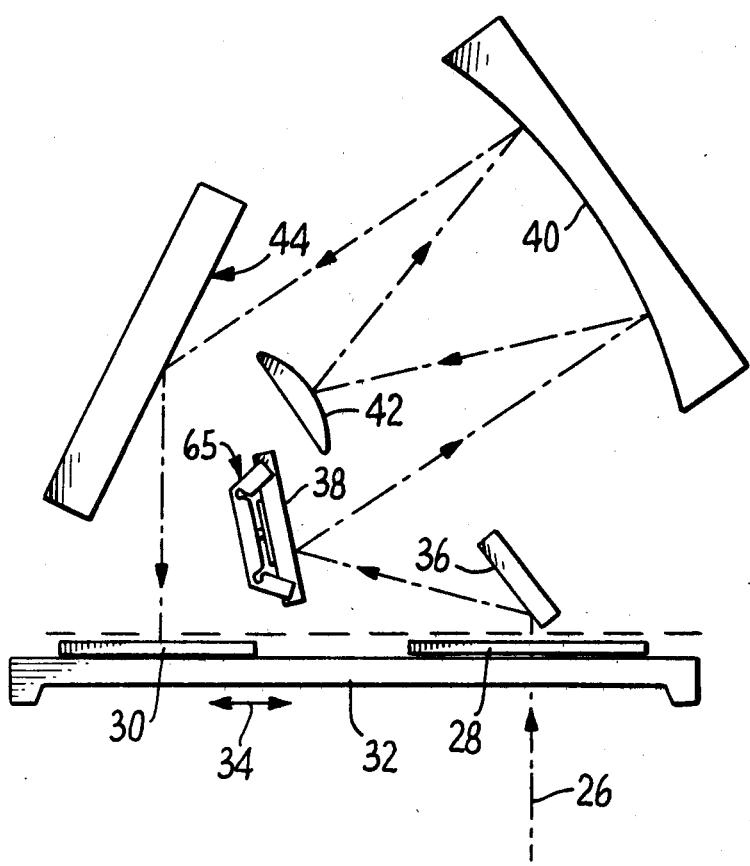
FIG. 2 is a semi diagramatic side view showing the light path through the printer shown in FIG. 1.

With reference to FIGS. 1 and 2 it will be understood that the basic machine to which the present invention is applicable is well known to those skilled in the art and will only be described in sufficient detail to allow one to understand the present invention. The machine includes a loader 12 wherein sensitized silicon or other semiconductor wafers can be loaded, an image head 14 where the wafers are exposed and a viewer 16 where one can view the wafer and mask prior to exposure to determine its correct placement. The electronics necessary to control the projection machine are contained within the cabinet 18 while cabinet 20 contains a power supply for the lamp. A lamp cooler 22 is provided and the wafers are discharged, after exposure, back to the loader 12.

Light is passed through a slit and emerges into the upper machine as an arcuate slit of light 26. A photo mask 28 and a sensitized wafer 30 to be exposed are held coplanar on sled 32 adapted to move back and forth across the bed of the printer as indicated by arrow 34. As was previously explained, light source 26 is actually a slit aperture running at right angles through the view, the object of the apparatus being that the light will pass through mask 28, be reflected by the mirrors later described and then expose the sensitized wafer 30. In this embodiment, the mirrors are so selected that the image of the mask is imposed on the wafer in exactly a 1-1 ratio. The light path is shown in dot-dash lines. It will be understood that all of the mirrors are first surface mirrors since the highest image quality is required. Thus, the light is reflected from a first flat mirror 36, a second flat mirror 38, a concave mirror 40, a convex mirror 42, back to 40 and finally from mirror 44 onto the wafer 30. The present invention centers around mirror 38 and its mounting and movement will be described in detail hereinafter.

If all machines were alike, all mirrors perfect, and all masks used in sequential exposures on a wafer were produced at precisely the same magnification, no registration problem would exist. However mirrors are not perfect and no two machines are alike and it is impossible to register masks and wafers with absolute precision. This is because of the extremely critical alignment tolerances which are required. Accordingly, it is highly desirable that some system be provided for slightly altering the size and position of the image to suitable tolerances. The degree of bending for the mirror to deflect the image is very slight and is typically $\pm 1\mu$ meter over a four inch wafer. This slight amount of bending does not degrade the image by more than one sixth $\lambda$ so that the image can be shifted for a sufficient distance to secure the desired result without causing excess degradation of the image.

Figure 3:
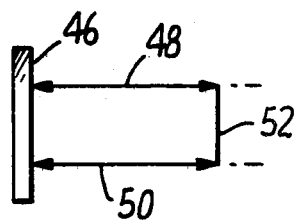
FIG. 3 is a diagramatic view showing the light path on a plane mirror.
Figure 4:
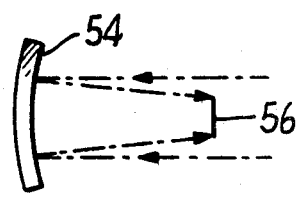
FIG. 4 is a diagramatic view showing the light path from a concave mirror.
Figure 5:
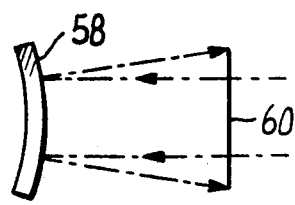
FIG. 5 is a diagramatic view showing the light path through a convex mirror.
Figure 11:
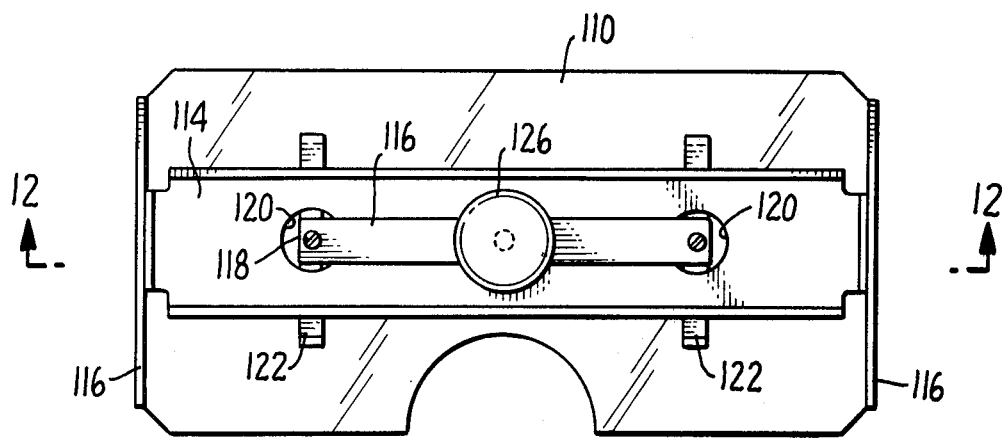
FIG. 11 is a plan view of another embodiment of the invention wherein a spring is employed with a mechanical means for placing force against the mirror.
Figure 12:
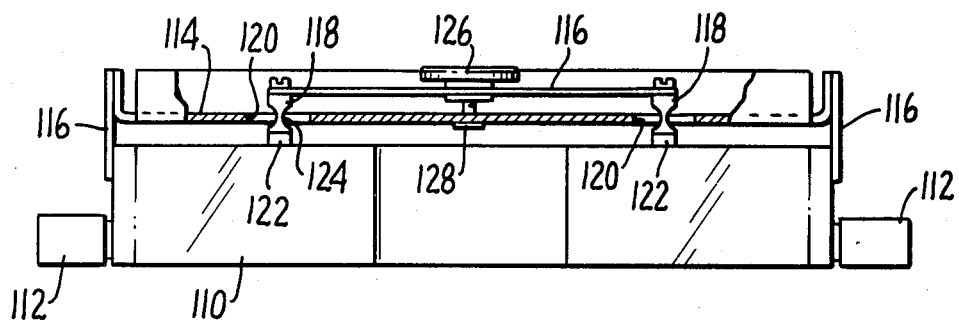
FIG. 12 is a section on the line 12—12 of FIG. 11.
Figure 13:
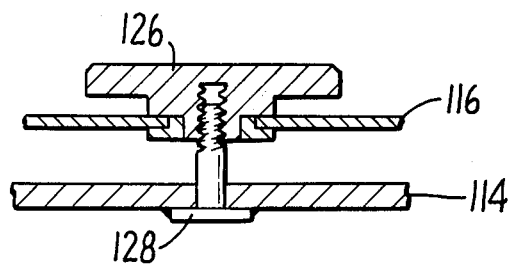
FIG. 13 is an enlarged detailed view of the adjusting mechanism.
Figure 14:
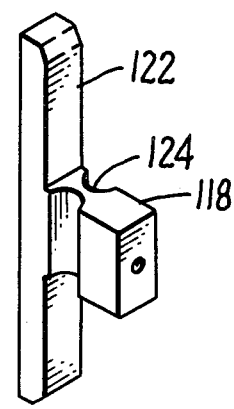
FIG. 14 is an enlarged perspective view of the pressure pad and flexure employed in this embodiment.

The effect of bending the mirror is shown in FIGS. 3, 4 and 5. It should be understood, of course, that for purposes of illustration these figures are grossly exaggerated and that the actual amount of bending would be imperceptible to the unaided eye. In FIG. 3 a plane mirror 46 is shown wherein it is seen that bundles of rays 48 and 50 are reflected on the same paths as they impinge on the mirror so that such a mirror produces an image 52 exactly the same size as the object. In FIG. 4 a concave mirror 54 is shown and here it is apparent that the rays which impinge on the mirror follow a converging path so that image 56 is substantially smaller than the object. In FIG. 5 a convex mirror 58 is shown and here it is apparent that the reflected rays follow a diverging path so that the image 60 is larger than the object.

FIGS. 6A, 6B and 6C show how advantage is taken of this slight change in image size to alter the position of the image and thus secure perfect registration. In FIG. 6A a pad 62 forming a portion of a substrate for an integrated circuit is shown. At 6B the image of the pad 62A is deflected in the direction shown by arrow 64A. In FIG. 6C, pad 62B is shown deflected in the direction of arrow 64B. Thus, by flexing mirror 38, one can secure precise registration from one exposure to the next and thus compensate for any possible differences between machines, imperfections in optics, or mask magnification.

Mirror 38 must be held in a strain-free manner that is independent of the forces that are used to add or subtract the small cylinder of power to the surface of the mirror. One method of holding the mirror in a strain-free relationship yet causing the mirror to flex is shown in FIGS. 7-10.

The mounting for the mirror has been generally designated 65 and this includes a rigid frame member 66 having upstanding end members 68 and inwardly extending lugs 70. In order to support the mirror in a strain-free manner and to provide accurate alignment of the mirror, the mirror is supported at three adjustable points located at the center of spherical bearings. This is achieved by cementing blocks 76 on each end of the mirror containing spherical bearings 76B, and fastending these end blocks to the lugs 70, utilizing studs 72, connected through Belleville springs 80 to the lugs 70. Nuts 73 on the studs 72 with springs 80 allow one to position the mirror precisely. The three-point suspension system is best seen in FIG. 10 wherein at the left hand side of the mirror mounting there are two of the studs 72 while there is a single stud 72 at the right hand side. In this manner the mirror is grasped at its two ends and can be precisely positioned by adjustment of the nuts 73 on studs 72.

The adjustment mechanism is generally designated 82 and this consists of an arm 83 which extends across the back of the mirror. Each arm has legs 85 which are cemented to the edges of the mirror. Thus it will be seen that the mirror itself supports the adjusting mechanism and that the adjusting mechanism is attached to the frame 65 only through the mirror. Notches 87 are provided between the back member 83 and the arms 85 leaving only a small section 89 between the two so that the small section can act as a hinge, the purpose of which is later explained in detail. In this embodiment of the invention the mirror is notched at 91 and has two attachment points which are designated 92 and 94 and are shown in dashed lines in FIG. 10. Attached to the back of each of these attachment points by a suitable adhesive are the pressure bars 88 and 90. Since the mirror is firmly held at the edges, pushing or pulling on these two bars 88 and 90 will result in the mirror being warped to a cylindrical configuration, respectively convex or concave.

In accordance with one embodiment of the present invention this is accomplished by pneumatic means utilizing two pistons. Since the two pistons are identical only one is described in detail. The piston assembly consists of a diaphram 92 which encloses cup 94 defined by wall 93 in member 82. A solid disc member 96 is attached to the diaphram with only a small gap at the periphery. The composite piston, made of the diaphram 92 and the solid disc member 96, is connected by means of a pin 98 to bar 88. Now as vacuum or pressure is introduced through line 100 the mirror will be warped either concave, as is shown by the dashed line 102 in FIG. 7 or convex as is shown in the dot-dash line 104. A manometer 106 filled with a suitable liquid (e.g. Hg) can be attached through tube 108 to cup 94 so that one can determine with great accuracy the pressure or vacuum which exists and thus the degree of distortion of the mirror. Thus, by introducing pressure or vacuum through line 100 one can distort or warp mirror 84 in a desired manner so that it is either concave or convex spherical. By the use of manometer 106 one can gauge accurately the amount of distortion produced in the mirror. Naturally when putting a wafer on sled 32, one would judge the position of the wafer vis-a-vis the mask and make an appropriate adjustment of the mirror to obtain the best possible coincidence. By the use of the bending mirror, one can make repeated exposures and obtain precise registration from one exposure to the next even should different printers be used for the different exposures.

In FIGS. 11-14 an alternate embodiment of the invention is shown wherein a mechanical system is employed to flex the mirror rather than the pneumatic system previously described. Here a notched mirror 110 is held at its edges by blocks 112 as previously described. An adjustment mounting plate 114 extends across the back of the mirror and is attached to the mirror by means of legs 116 having the hinged construction previously described. A flat spring 116 extends partially across the back plate and at each end blocks 118 extend downwardly through openings 120 to the pressure pads 122 attached to the centroids of the mirror as previously described. Blocks 118 are cut away at a mid point as at 124 so that they are somewhat flexible. At the center of the spring is an adjustment knob 126 which is threadably mounted onto a stud 128 pressed into spring 116. Thus, by turning knob 126 one can put more or less tension on the mirror causing it to flex.

Figure 15:
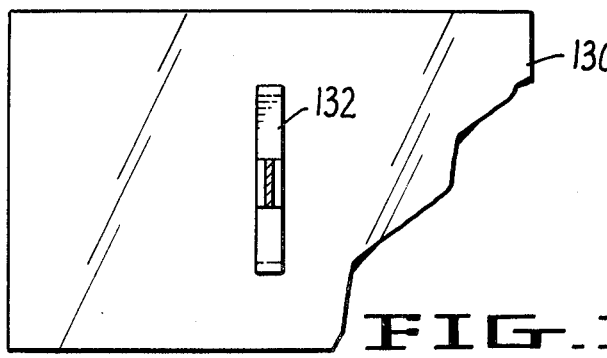
FIG. 15 is a diagramatic view showing how the invention is applied to a rectangular mirror.

In the embodiments described thus far, a notched mirror has been employed having two centroids. If a rectangular mirror is employed only a single pressure pad and adjusting mechanism is necessary. Thus, in FIG. 15 mirror 130 is provided with a single pressure pad 132 and this pressure pad is caused to press or pull against the mirror by means previously described.

Since the amount of bending introduced in to the mirror is very slight it is necessary that compensation be made for any possible temperature variations which might otherwise interfere with the precision optics. In the embodiment shown in FIGS. 1-10, temperature compensation takes place automatically. The amount of pressure exerted against the mirror in either direction is substantially independent of the slight variations which might result from expansion or contraction of the member holding the pistons but, instead, it depends almost entirely on the difference in pressure between the inside of the piston, i.e. plenum 94 and ambient pressure. Also, this pressure is substantially independent of the ambient temperature since the mass outside the piston will have substantially the same temperature as the temperature inside the plenum, so as the ambient pressure varies, a differential pressure regulator that references the ambient pressure maintains the differential pressure in the piston so that the bending force on the mirror is constantly maintained. In a similar way, if the increase in ambient temperature increases the pressure in the piston, the differential pressure regulator will control the differential pressure between the piston and atmosphere to maintain a constant bending force on a mirror.

In the embodiment of the invention shown in FIGS. 11-14, a different temperature compensation scheme is employed. In this embodiment of the invention the mirror supports 112 are made of invar which has an extremely low coefficient of expansion. The back plate 114 as well as the legs 118 are made of aluminum which has a relatively high rate of expansion. The stud 126 similarly has a high rate of thermal expansion. Thus, if the temperature rises, the distance separating plate 114 from the mirror will become greater but at the same time the length of stud 126 will become greater so that the expansion of one member offsets that of the other. The spring 116 for deflecting the mirror is chosen with a spring constant that is substantially constant over the range of deflections that would be experienced due to temperature variations.

Forces in both embodiments are kept normal to the mirror by the flexure 124 that prevents the piston or spring from delivering bending moments to the mirror.

Although certain specific embodiments of this invention have been disclosed, it will be obvious to those skilled in the art that many variations can be made without departing from the spirit of this invention. For instance, the bending could be applied to any of the mirrors or even more than one mirror. Mirror 38 was selected for bending only because of its easy accessibility in this particular machine. The optical system has been described as a 1:1 system but other ratios of mask to wafer might be employed.

The particular arrangement of mirrors has been shown only to illustrate the invention. Further, in this particular machine the bending produces a cylinder. By means well known to those skilled in the art, the mirror could be bent on more than one plane to produce a spherical or parabolic surface. A rectangular mirror is preferably bent on its short axis but it cold be bent on its long axis.

The subject matter to be claimed is:

1. In a projection printer wherein the image of a mask is projected through a narrow slit having a longitudinal axis extending from one side of the mask to the other and the image of the mask moves at a right angle to the longitudinal axis of the slit to expose the entire mask by means including at least one plane mirror into a sensitized wafer and wherein said mirror is anamorphically distorted to alter the image size in a direction perpendicular to the longitudinal axis of said slit, the improvement comprising:
   a. means for gripping said plane mirror only along points of contact which are parallel with the longitudinal axis of said slit whereby said mirror is held in a strain-free relationship, and whereby said mirror can only be deformed about axes parallel to the longitudinal axis of said slit;
   b. frame means supported by said mirror, said frame means extending across the back of said mirror in a direction perpendicular to the longitudinal axis of said slit;
   c. pressure means extending between said frame means and said mirror for distorting said mirror anamorphically about one or more axes parallel to the longitudinal axis of said slit.

2. The printer of claim 1 wherein said pressure means is an adjustable spring means.

3. The printer of claim 1 wherein said pressure means is pneumatic.

* * * * *